US012760411B2

(12) United States Patent
Lehn

(10) Patent No.: US 12,760,411 B2

(45) Date of Patent: Oct. 13, 2026

(54) METHODS OF FORMING A METAL CARBIDE OR A METAL CARBIDE MATERIAL, METHODS OF FORMING AN ELECTRONIC DEVICE, AND RELATED ELECTRONIC DEVICES AND SYSTEMS

(71) Applicant: Micron Technology, Inc., Boise, ID (US)

(72) Inventor: Jean-Sebastien M. Lehn, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 1028 days.

(21) Appl. No.: 17/656,341

(22) Filed: Mar. 24, 2022

(65) Prior Publication Data

US 2023/0304147 A1 Sep. 28, 2023

(51) Int. Cl.

| | |
|---|---|
| ***C23C 16/32*** | (2006.01) |
| ***C23C 16/455*** | (2006.01) |
| ***C23C 28/04*** | (2006.01) |
| ***H10D 64/60*** | (2025.01) |
| ***H10P 14/43*** | (2026.01) |

(52) U.S. Cl.

CPC ........ *C23C 16/32* (2013.01); *C23C 16/45527* (2013.01); *C23C 28/04* (2013.01); *H10D 64/60* (2025.01); *H10P 14/432* (2026.01)

(58) Field of Classification Search

CPC ................ C23C 16/32; C23C 16/0272; C23C 16/45527; C23C 28/04; H10D 64/60; H01L 21/28562

See application file for complete search history.

(56) References Cited

U.S. PATENT DOCUMENTS

| | | | | |
|---|---|---|---|---|
| 8,795,771 | B2 | 8/2014 | Barry et al. | |
| 2007/0148350 | A1* | 6/2007 | Rahtu | H01L 21/28562 427/249.17 |
| 2008/0102613 | A1 | 5/2008 | Elers | |
| 2009/0315093 | A1 | 12/2009 | Li et al. | |
| 2016/0027614 | A1 | 1/2016 | Manna et al. | |
| 2019/0169768 | A1 | 6/2019 | Mori et al. | |
| 2023/0146757 | A1* | 5/2023 | Fujikawa | H10P 14/3408 438/778 |

OTHER PUBLICATIONS

Role of vapor pressure of 1,4-bis(trimethylsilyl)benzene in developing silicon carbide thin film using a plasma-assisted liquid injection chemical vapor deposition process, J. Selvakumar et al. / Surface & Coatings Technology 205 (2011) 3493-3498.*

The Chemical Vapor Deposition of Zirconium Carbide onto Ceramic Substrates, Glass, J.A., Palmisiano, N. & Welsh, R.E., MRS Online Proceedings Library 555, 185-190 (1998).*

Anasori et al., 2D Metal Carbides and Nitrides (MXenes) for Energy Storage, Nature Reviews, vol. 2, No. 16098, (2017), 17 pages.

Benndorf et al., Identification of Carbon and Tantalum Chemical States in Metal-Doped a-C:H Films, Surface and Coatings Technology, 36 (1988) , pp. 171-181.

Dimigen et al., Tribological and Electrical Properties of Metal-Containing Hydrogenated Carbon Films, Applied Physics Letters, vol. 50, No. 16, (Apr. 1987), 3 pages.

Evans et al., Influence of Deposition Parameters on the Composition and Structure of Reactivity Sputtered Nanocomposite TaC/a-C:H Thin Films, Journal of Materials Research, vol. 20, No. 9, (Sep. 2005), 14 pages.

Grillo et al., Understanding and Controlling the Aggregative Growth of Platinum Nanoparticles in Atomic Layer Deposition: An Avenue to Size Selection, The Journal of Physics Chemistry Letters, 8 (2017), pp. 975-983.

Grischke et al., Preparation, Properties and Structure of Metal Containing Amorphous Hydrogenated Carbon Films, Materials & Manufacturing Processes, 8(4&5), (1993), pp. 407-417.

Jansson et al., Sputter Deposition of Transition-Metal Carbide Films—A Critical Review From A Chemical Perspective, Thin Solid Films, 536 (2013), pp. 1-24.

Leon Maya, Deposition of Amorphous Hydrogenated Silicon Carbide Films Using Organosilanes in an Argon/Hydrogen Plasma, Journal of Vacuum Science & Technology A 12, 754 (1994): (https://doi.org/10.1116/1.578819), 7 pages.

Nakamura et al., TaC-Coated Graphite Prepared Via a Wet Ceramic Process: Application to CVD Susceptors for Epitaxial Growth of Wide-Bandgap Semiconductors, Journal of Crystal Growth, 478 (2017), pp. 163-173.

Selvakumar et al., Role of Vapor Pressure of 1,4-bis(trimethylsilyl)benzene in Developing Silicon Carbide Thin Film Using a Plasma-Assisted Liquid Injection Chemical Vapor Deposition Process, Surface & Coatings Technology, 205 (2011), pp. 3493-3498.

Vaid et al., Structural Dichotomy in Six-Coordinate do Complexes: Trigonal Prismatic (tBu3SiC=C)6Ta and Octahedral (tBu3SiC=C)6M2- (M=Zr, Hf), Journal of American Chemical Society, 120 (1998), 13 pages.

* cited by examiner (Continued)

*Primary Examiner* — Haidung D Nguyen

(74) *Attorney, Agent, or Firm* — TraskBritt

(57) ABSTRACT

Methods of forming a metal carbide or a metal carbide material. The method includes reacting a metal precursor with a base material to form a metal on the base material. The metal precursor comprises the chemical formula $MX_n$, where M is a metal, X is a leaving group, and n is an oxidation state of the metal. A carbon-containing precursor comprising at least one alkyne group or an organometallic alkene is reacted with the metal to form carbon on the metal. The metal and the carbon are reacted to form a metal carbide or a metal carbide material on the base material by ALD. Methods of forming an electronic device and related electronic devices and electronic system are also disclosed.

12 Claims, 4 Drawing Sheets

METHODS OF FORMING A METAL CARBIDE OR A METAL CARBIDE MATERIAL, METHODS OF FORMING AN ELECTRONIC DEVICE, AND RELATED ELECTRONIC DEVICES AND SYSTEMS

TECHNICAL FIELD

Embodiments disclosed herein relate to methods and device fabrication. More particularly, embodiments of the disclosure relate to methods of forming a metal carbide or a metal carbide material, methods of forming an electronic device, and to related electronic devices and systems.

BACKGROUND

Metal carbides are sought after conductive materials in the semiconductor industry. For instance, metal carbides may be used as electrodes for flash memory devices. Carbon-rich materials including metals are particularly desirable because the conductivity of carbon-rich materials can be tuned by adjusting the amount of metal present in the material. For example, hydrogenated amorphous carbon layers (α-C:H) doped with 10 mol % Ru exhibited an increase in conductivity by fourteen orders of magnitude as compared to an undoped α-C:H material.

However, carbon-rich films are known for their poor adhesion to surfaces. The introduction of metal atoms into carbon-rich films can improve adhesion of the metal-carbon material to surfaces. PVD methods, such as RF sputtering or DC-magnetron sputtering, have been used to incorporate metals when forming metal carbide materials. These methods have produced films of metal-doped hydrogenated amorphous carbon (α-C:H) (i.e., M-C:H films, where M is a metal). These methods tend to produce metal carbides that are rich in the metal species (i.e., the atomic ratio of metal to carbon is greater than 1). For metal carbides that are rich in carbon, a superstoichiometric metal carbide has been reported using RF sputtering, where the metal carbide has the chemical formula $MC_{2-n}$, where n may be $0<n<1$.

Alternative methods of forming metal carbides include high-temperature etching of MAX precursors, where MAX materials are ternary carbides having at least two metals, A and M, and X is carbon or nitrogen. MAX materials may be etched with hydrofluoric acid (HF) or a mixture of a strong acid and a fluoride salt, such as a mixture of HCl and LiF to form HF in situ. These methods tend to create metal carbides or metal nitrides of the chemical formula $M_aX_b$, where M is a metal, X is carbon or nitrogen, and a is an integer greater than b.

DETAILED DESCRIPTION

Figure 1:
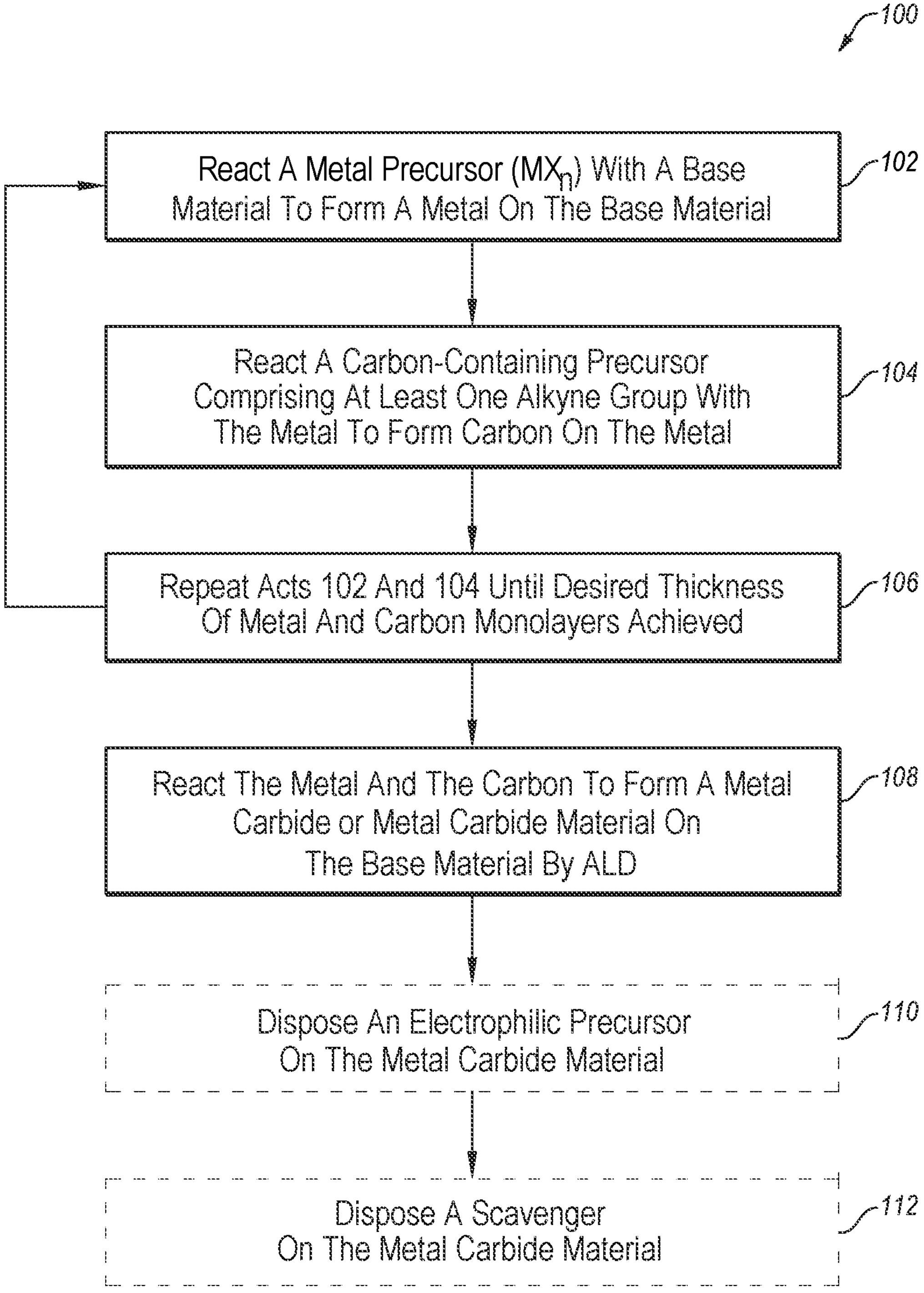
FIG. 1 is a flowchart of a method of forming a metal carbide according to embodiments of the disclosure.

Methods for forming metal carbides or metal carbide materials are disclosed using a metal precursor and a carbon-containing precursor. The metal carbide and the metal carbide material may be formed by an ALD process at a relatively low temperature and without using a plasma. By appropriately selecting the metal precursor and the carbon-containing precursor, the metal carbide and metal carbide material may be formed at the relatively low temperature, which enables temperature sensitive materials or features in an electronic device (e.g., semiconductor device, memory device) to be present. The carbon-containing precursor may be an organometallic alkyne (e.g., a polyalkyne) or an organometallic alkene (e.g., a polyalkene). Because of the relatively low reaction temperature, the methods described herein may be used to form complex electronic devices that include thermally sensitive materials or devices without exceeding the respective thermal budget and damaging the thermally sensitive materials or devices. Additionally, the methods described herein advantageously avoid the production of reactive halogen-containing species and do not use a plasma. The ALD methods of forming the metal carbides and the metal carbide materials according to embodiments of the disclosure are an equally effective yet benign alternative to conventional methods of forming metal carbides or metal carbide materials using PVD or CVD, both of which rely on high temperatures and plasmas to form metal carbide materials. Electronic devices including the metal carbides and metal carbide materials are also disclosed.

The following description provides specific details, such as material types, material thicknesses, and process conditions, in order to provide a thorough description of embodiments described herein. However, a person of ordinary skill in the art will understand that the embodiments disclosed herein may be practiced without employing these specific details. Indeed, the embodiments may be practiced without employing these specific details. The embodiments may be practiced in conjunction with conventional fabrication techniques employed in the semiconductor industry. In addition, the description provided herein does not form a complete description of an electronic device or a complete process flow for manufacturing the electronic device and the systems described below do not form a complete electronic device. Only those process acts and systems necessary to understand the embodiments described herein are described in detail below. Additional acts to form a complete electronic device may be performed by conventional techniques.

Drawings presented herein are for illustrative purposes only, and are not meant to be actual views of any particular material, component, structure, electronic device, or electronic system. Variations from the shapes depicted in the drawings as a result, for example, of manufacturing techniques and/or tolerances, are to be expected. Thus, embodiments described herein are not to be construed as being limited to the particular shapes or regions as illustrated, but include deviations in shapes that result, for example, from manufacturing. For example, a region illustrated or described as box-shaped may have rough and/or nonlinear features, and a region illustrated or described as round may include some rough and/or linear features. Moreover, sharp angles that are illustrated may be rounded, and vice versa. Thus, the regions illustrated in the figures are schematic in nature, and their shapes are not intended to illustrate the precise shape of a region and do not limit the scope of the present claims. The drawings are not necessarily to scale. Additionally, elements common between figures may retain the same numerical designation.

As used herein, the singular forms "a," "an," and "the" are intended to include the plural forms as well, unless the context clearly indicates otherwise.

As used herein, "and/or" includes any and all combinations of one or more of the associated listed items.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, the term "substantially" in reference to a given parameter, property, or condition means and includes to a degree that one of ordinary skill in the art would understand that the given parameter, property, or condition is met with a degree of variance, such as within acceptable manufacturing tolerances. By way of example, depending on the particular parameter, property, or condition that is substantially met, the parameter, property, or condition may be at least 90.0% met, at least 95.0% met, at least 99.0% met, or even at least 99.9% met.

As used herein, spatially relative terms, such as "adjacent," "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped) and the spatially relative descriptors used herein interpreted accordingly.

As used herein, the term "mole fraction" and/or "mol percent" or "mol %" may be used to describe the relative proportion of a chemical element relative to the total molecular composition. A mole fraction of a molecule corresponds to the number of molecules (or moles) of one component divided by the total number of molecules (or moles) in the mixture. By nonlimiting example, a compound of the chemical formula $MX_2$ comprises component M present with a mole fraction of 0.33 and another component X present with a mole fraction of 0.67. The mol % is obtained by multiplying the mole fraction by 100.

As used here, the term "atomic composition" or "atomic percent" or "atomic %" means and includes the relative proportion of a chemical element relative to the total chemical composition.

As used herein, the term "electronic device" includes, without limitation, a memory device, as well as semiconductor devices, which may or may not incorporate memory, such as a logic device, a processor device, or a radiofrequency (RF) device. Further, an electronic device may incorporate memory in addition to other functions such as, for example, a so-called "system on a chip" (SoC) including a processor and memory, or an electronic device including logic and memory. The electronic device may be a 3D electronic device, such as 3D DRAM memory device, a 3D crosspoint memory device, a 3D PCRAM memory device, etc.

As used herein, the term "substrate" means and includes a foundation material or construction upon which components, such as those within a semiconductor device or electronic device are formed. The substrate may be a semiconductor substrate, a base material, a base semiconductor material on a supporting structure, a metal electrode, or a semiconductor substrate having one or more materials, structures, or regions formed thereon. The substrate may be a conventional silicon substrate or other bulk substrate including a semiconductive material. As used herein, the term "bulk substrate" means and includes not only silicon wafers, but also silicon-on-insulator ("SOT") substrates, such as silicon-on-sapphire ("SOS") substrates or silicon-on-glass ("SOG") substrates, epitaxial layers of silicon on a base semiconductor foundation, or other semiconductor or optoelectronic materials, such as silicon-germanium ($Si_{1-x}Ge_x$, where x is, for example, a mole fraction between 0.2 and 0.8), germanium (Ge), gallium arsenide (GaAs), gallium nitride (GaN), or indium phosphide (InP), among others. Furthermore, when reference is made to a "substrate" in the following description, previous process stages may have been utilized to form materials, regions, or junctions in or on the base semiconductor structure or foundation.

As used herein, the term "metal carbide" means and includes a compound including at least one metal atom and at least one carbon atom, and includes at least one metal-carbon bond. The metal carbide has the chemical formula $MC_n$, where M is a metal, n is a rational number from about 1.0 to about 7.0. The metal carbide is formed by ALD from the metal precursor and the carbon-containing precursor.

As used herein, the term "metal carbide material" means and includes a material comprising one or more metal carbide dispersed within a matrix, where the matrix may be a carbon-rich matrix or a metal-rich matrix. The metal carbide in the metal carbide material may be formed as a metal carbide nanocomposite, nanocluster, nanoparticle, or the like. The metal carbide may be dispersed within the carbon-rich matrix. For example (and not by limitation), the metal carbide material may comprise a metal carbide nanocomposite of a superstoichiometric metal carbide of the chemical formula $MC_n$, where n is a rational number from about 2.0 to about 7.0. The carbon-rich matrix may be substantially comprised of carbon, such as including from about 70.0 atomic percent to about 99.9 atomic percent of carbon. In some embodiments, the carbon-rich matrix comprises from about 85.0 atomic percent to about 99.9 atomic percent of carbon. In other embodiments, the carbon-rich matrix comprises from about 90.0 atomic percent to about 99.9 atomic percent of carbon. In some embodiments, the metal carbide material may further include a metal-doped carbon-rich region, where one or more metal is dispersed throughout the carbon-rich matrix but do not interact with the carbon-rich matrix. In some embodiments, the metal carbide material may further include a metal-rich region, which exhibits predominantly metallic character (e.g., high conductivity) and comprises from about 50 atomic percent to about 100 atomic percent of the metal.

As used herein, "superstoichiometric metal carbide" means and includes a metal carbide of the chemical formula MG, where the atomic ratio between the metal (M) and carbon (C) may be expressed as M:C and exceeds 1:1.

As used herein, “carbon-rich” means and includes a material comprising carbon and at least another component (e.g., a chemical element), where the concentration of carbon is higher than the concentration of the other component. By nonlimiting example, a binary compound comprising carbon and another component is “rich” in carbon, if carbon is present at least at about 51 atomic percent of the total chemical compound.

As used herein, the term “alkyl” means and includes a saturated, unsaturated, linear, branched, or cyclic hydrocarbon chain including from one carbon atom ($C_1$) to ten carbon atoms ($C_{10}$), such as from one carbon atom ($C_1$) to six carbon atoms ($C_6$).

As used herein, the term “alkoxide” means and includes an alkyl group linked to an oxygen atom including, but not limited to, a methoxy group, an ethoxy group, a propoxy group, a butoxy group, a pentoxy group, a hexoxy group, a heptoxy group, an octoxy group, a nonoxy group, or a decoxy group, a phenyloxide, an aryloxide, an alkylsilyloxide, or an alkoxy-substituted alkoxy group (e.g., a polyether group), such as a methoxy methoxy group, a methoxy ethoxy group, an ethoxy methoxy group, an ethoxy ethoxy group, a methoxy ethoxy ethoxy group, etc. The alkoxide may be linear or branched, such as an iso-propylalkoxide, a tert-butylalkoxide. The alkoxide moiety may have a chelating group. Chelating groups could be, for example, a dialkylamido group, or an alkylsulfide group.

As used herein, the term “substituted” means and includes a functional group where one or more hydrogen atoms have been replaced by another functional group, such as an alkyl group, an alkoxide group, an amide group, an amine group, or a halogen group.

As used herein, the term “amide” means and includes a —NR'R" group where R' and R" are independently an alkyl group, a substituted alkyl group, an amide group, a substituted amide group, an amine group, a substituted amine group, an alkylsilyl group, a silyl group, or a combination thereof. Additionally, the amide moiety may have a chelating group. Chelating groups could be, for example, an alkoxide group, or an alkylsulfide group.

As used herein, the term “amine” means and includes an —$NH_2$ group.

As used herein, the term “alkylamino” means and includes an —NR'R" group, where $R_1$ and $R_2$ are each are independently an alkyl group, a substituted alkyl group, an amide group, a substituted amide group, an amine group, a substituted amine group, where the alkyl group may be linear or branched.

As used herein, the term “halogen” means and includes fluoro, chloro, bromo, or iodo.

The metal precursor used to produce the metal carbide may have the chemical formula of $MX_n$, where M is a metal, X is a leaving group. The value of “n” is a rational number between 1.0 and 7.0 that may correspond to an oxidation state of the metal. Alternatively, the metal precursor may have the chemical formula of ($M^1X^1X^2$), where $X^2$ is a leaving group that is different from $X^1$. The metal in the metal precursor may be a Group IV or Group V element. The metal in the metal precursor may be, for example, tantalum (Ta), titanium (Ti), tungsten (W), molybdenum (Mo), antimony (Sb), zirconium (Zr), hafnium (Hf), arsenic (As), germanium (Ge), tin (Sn), gallium (Ga), indium (In), zinc (Zn), bismuth (Bi), copper (Cu), silver (Ag), niobium (Nb), or any combination thereof. The metal may also be any element from the periodic table.

The leaving group (X) of the metal precursor may be a halide, an alkyl, an alkene, an alkyne, an alkoxide, an alkylamide, a sulfide, a selenide, a telluride, an alkylsilane, carbon monoxide, a cyclopentadienyl, a substituted cyclopentadienyl, an allyl, a substituted allyl, an alkoxide, a substituted alkoxide, an alkylamino, a substituted alkylamino, a dialkylamido, a alkylsilylamido, a dilsilylamido, an alkylsulfide, an alkylselenide, an alkyltelluride, a trialkylsilyl, an isocyanate, a substituted isocyanate, a thiocyanate, a substituted thiocyanate, an isothiocyanate, a substituted isothiocyanate, a cyanide, a nitrate, a borohydride, a hydride, an acetylacetonate, an N-substituted acetylacetonate, an oxo, a thio, a seleno, a telluro, an imido, a silylimido, an amidinate, a guanidinate, a diazodiene, a carboxylate, a pyrrazolate, a pyrrole, a phosphide, a phosphine, a halide, or any combination thereof.

The alkoxide may be a C1 to C10 alkoxide, such as methoxide, ethoxide, iso-propylalkoxide, tert-butylalkoxide, etc. The alkoxide may be linear or branched. The alkoxide may chelate the metal. The alkoxide may also be a dialkoxide, such as an alkoxide derived from ethylene glycol (e.g., $Me_3Si—CH_2CH_2—SiMe_3$).

The alkylsilane may have the formula $Si(R^1R^2R^3)$, where each of $R^1$, $R^2$, and $R^3$ are independently selected from a hydrogen, an alkane, a substituted alkane, an alkoxide, a substituted alkoxide, an aryl, a substituted aryl, a phenyl, a substituted phenyl, or any combination thereof. The alkylsulfide may be methylsulfide, ethylsulfide, ispropylsulfide, tert-butylsulfide, arylsulfide, etc. The alkylselenide may be methylselenide, ethylselenide, isorpropylselenide, tert-butylselenide, arylselenide, etc. The alkyltelluride may be methyltelluride, ethyltelluride, isopropyltelluride, tert-butyltelluride, aryltelluride, etc. The trialkylsilyl may be antimony bis(trimethylsilyl)silane ($Sb(SiMe_3)_2$). The thiocyanate may be trimethylsilyl-thiocyanate ($SiMe_3—SCN$). The isothiocyanate may be trimethylsilyl-isothiocyanate ($SiMe_3—NCS$). The cyanide may also be a substituted cyanide, such as acetonitrile (MeCN). The nitrate may be hafnium nitrate ($Hf(NO_3)_4$). The borohydride may be hafnium borohydride ($Hf(BH_4)_4$). The hydride may be borane ($BH_3$) or silane ($SiH_4$). The acetylacetonate may be a fluorinated acetylacetonate or a substituted acetylacetonate. The N-substituted acetylacetonate may be a fluorinated N-substituted acetylacetonate. The imide (NR) or silylimide ($NSiR_3$) may be a substituted imide or silyl imide, where the substituent may be an alkane, an alkene, an alkyne, an alkoxide, a substituted alkoxide, or any combination thereof. For example, the metal precursor may be $(tBuN)_2Mo(NMe_2)_2$ or $(tBuN)_2W(NMe_2)_2$. The amidinate may be of the chemical formula RNCR'═NR, and the guanidinate may be of the chemical formula $RNCNR'_2$═NR, and the amidinate or guanidinate may be monomeric, dimeric, or trimeric. For example, a metal precursor comprising a dimeric amidinate may be of the chemical formula $M_2(RNCR'═NR)_2$ (e.g., $Cu_2(RNCR'═NR)_2$), and a metal precursor comprising a trimeric amidinate may be of the chemical formula $M_3(RNCR'═NR)_3$ (e.g., $Ag_3(RNCR'═NR)_3$). The diazodiene is of the chemical formula $RNCH_2CH_2NR$, where R may be a hydrogen, an alkane, a substituted alkane, an alkoxide, a substituted alkoxide, an aryl, a substituted aryl, a phenyl, a substituted phenyl, or any combination thereof. The carboxylate is of the chemical formula $RCO_2$, where R may be a hydrogen, an alkane, a substituted alkane, an alkoxide, a substituted alkoxide, an aryl, a substituted aryl, a phenyl, a substituted phenyl, or any combination thereof. The pyrrazolate is of the chemical formula $C_3R_3N_2$, where R is a hydrogen, an alkane, a substituted alkane, an alkoxide, a substituted alkoxide, an amino, or a combination thereof. The leaving group may be a bi-dentate ligand, where metal-coordinating atoms may be oxygen (O), nitrogen (N), or sulfur (S). The bi-dentate ligand may have a bridging ethyl group between the metal-coordinating atoms. The bi-dentate ligand may be an alkylamino alkoxide or an alkylamino sulfide. The leaving group may be a phosphide ($PR_2$), where R may be a hydrogen, an alkane, a substituted alkane, an alkoxide, a substituted alkoxide, an aryl, a substituted aryl, a phenyl, a substituted phenyl, or any combination thereof. The metal precursor may function as a source of metal for the metal carbide.

In some embodiments, the metal precursor may be reduced using a reducing agent. To control the oxidation state of the metal of the metal carbide, the metal precursor may be reacted with a reducing agent, such as hexamethyldisilane, to remove the leaving group (X) from the metal precursor. For example, tantalum pentachloride may be reacted with hexamethyldisilane to produce tantalum tetrachloride and trimethylchlorosilane. In other words, the hexamethyldisilane removes a chloro group from tantalum pentachloride, thus reducing the oxidation state of tantalum. The produced tantalum tetrachloride may be subsequently reacted with the carbon-containing precursor to form a tantalum carbide material. The reducing agent may be, but is not limited to, a disilane, a digermane, a distannane, a polysilane with at least one Si—Si bond, a polygermane with at least one Ge—Ge bond, a compound with one Si—Ge bond, or any combination thereof.

The carbon-containing precursor used to produce the metal carbide comprises at least one carbon-carbon triple bond (i.e., an alkyne group) or carbon-carbon double bond (i.e., an alkene group). The carbon-containing precursor may function as a source of carbon for the metal carbide. When the carbon-containing precursor includes the alkyne group, the resulting metal carbide is substantially free of hydrogen atoms. The carbon-containing precursor may be an organometallic compound, such as an organometallic alkyne (or organometallic acetylene) or an organometallic alkene. When the desired metal carbide is to be substantially free of hydrogen atoms, the carbon-containing precursor is an organometallic alkyne compound. By way of example only, the organometallic alkyne compound may have the chemical formula $R^1R^2R^3(A)$-$C_i$-$(Z)R^4R^5R^6$, wherein each of $R^1$, $R^2$, $R^3$, $R^4$, $R^5$, and $R^6$ is independently selected from a hydrogen, an alkyl group, a substituted alkyl group, an alkoxide, a substituted alkoxide, an alkylamino, a substituted alkylamino, a dialkylamido, a halide, or any combination thereof; wherein i is 2, 4, or 6; and wherein A and Z are independently selected from Si, Ge, and Sn. The carbon-containing precursor may be symmetric, where A and Z are the same and each of $R^1$, $R^2$, $R^3$, $R^4$, $R^5$, and $R^6$ are the same. The carbon-containing precursor may be asymmetric, where A and Z are different and each of $R^1$, $R^2$, $R^3$, $R^4$, $R^5$, and $R^6$ are the different. The carbon-containing precursor may include at least one alkyne group as in the following structures:

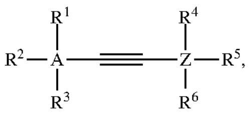

-continued

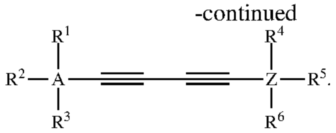

The carbon-containing precursor may be a benzene-substituted organometallic compound of the chemical formula $(R^1R^2R^3)A$-$C_6H_4$—$Z(R^4R^5R^6)$. In some embodiments, the carbon-containing precursor is $(CH_3)_3$—Si—$C_6H_4$—Si$(CH_3)_3$, which results in incorporation of hydrogen atoms in the metal carbide material. In some embodiments, more than one benzene group is present between A and Z. In some embodiments, the benzene groups are substituted with functional groups such as an alkyl group, a substituted alkyl group, an alkoxide, a substituted alkoxide, an alkylamino, a substituted alkylamino, a dialkylamido, a halide, or any combination thereof. For example, the carbon-containing precursor may be bis(triethylsilyl)acetylene, 1-(triethylsilyl), 2-(trimethylsilyl)acetylene, or 1-(dimethylethyl), 2-(trimethylsilyl)acetylene.

The metal carbide may be formed by the reaction of the metal precursor and the carbon-containing precursor having the alkyne group or the alkene group, and the reaction may be generally described as:

$$2MX_n+n(AR^1R^2R^3)C_2(ZR^4R^5R^6)\rightarrow M_2(C_2)_n+n(AR^1R^2R^3)X+n(ZR^4R^5R^6)X$$

In some embodiments, the reaction may proceed partially, such as the reaction between pentakis(dimethylamido)tantalum and bis-trimethylsilylethyne:

$$2Ta(NMe_2)_5+Me_3SiCCSiMe_3\rightarrow(Me_2N)_4TaCCTa(NMe_2)_4+2Me_3SiNMe_2$$

The resulting metal carbide ($M_2C_2X_{n-2}$) includes at least one metal-carbon bond and may further include at least one leaving group from the metal precursor. The resulting metal carbide may be an electrically conductive material that includes a stoichiometric metal carbide compound or a non-stoichiometric metal carbide compound, such as a superstoichiometric metal carbide. The metal carbide may be, for example, a tungsten carbide ($WC_6$), a tantalum carbide ($TaC_5$), a molybdenum carbide ($MoC_5$), or a titanium carbide ($TiC_4$). In some embodiments, the metal carbide is substantially free of hydrogen atoms. In other embodiments, the metal carbide is substantially free of hydrogen atoms and oxygen atoms. In some embodiments, the reaction may proceed according to the following general partial reaction, where the metal precursor comprises the general formula $MX^1X^2$:

$$2MX^1_nX^2_p+2(AR^1R^2R^3)C_2(ZR^4R^5R^6)\rightarrow M_2C_4+n(AR^1R^2R^3)X^1+n(ZR^4R^5R^6)X^1+2pX^2$$

where the sum of n and p may be 5, 6, or 7, $X^1$ and $X^2$ are each independently selected from a halide, an alkyl, an alkene, an alkyne, an alkoxide, an alkylamide, a sulfide, a selenide, a telluride, an alkylsilane, carbon monoxide, or any combination thereof. In some embodiments, p is a rational number less than n. In some other embodiments, $X^1$ and $X^2$ are different. In some other embodiments, $X^1$ and $X^2$ are the same. For example, dibromotetracarbonyl tungsten ($WBr_2(CO)_4$) may partially react with bis(trimethylsilyl)acetylene to form tungsten carbide according to the following reaction:

$$2WBr_2(CO)_4+2Me_3Si—CC—SiMe_3\rightarrow W_2(CC)_2+4Me_3SiBr+8CO.$$

The metal carbide material comprises a metal carbide structure, which may include a superstoichiometric metal carbide. The metal carbide comprises a superstoichiometric metal carbide according to embodiments of the disclosure as described above, where the metal carbide has a chemical formula of $MC_n$, where M is a metal, C is carbon, and n corresponds to a rational number between 2.0 and 7.0. In some embodiments, n corresponds to a rational number between 3.0 and 7.0. In some embodiments, the metal carbide material comprises a metal content of from about 0.5 atomic percent of metal to about 20.0 atomic percent of metal.

The metal carbide may be formed by reacting the metal precursor and the carbon-containing precursor, and repeated formation of the metal carbide produces metal carbide structures in the metal carbide material. The metal carbide structures may include metal carbide nanoclusters, metal carbide nanocomposites (MCNs), or metal carbide nanoparticles (MCNPs) in the carbon-rich matrix. Without being bound by a particular theory, the metal formed (e.g., deposited) may form metal aggregates that react with the carbon-containing precursor to produce the metal carbide in metal carbide aggregates. After repeated deposition acts, the metal carbide aggregates may grow and produce metal carbide nanoclusters, MCNs, MCNPs, or a combination thereof. In some embodiments, the metal carbide structures may form from metal carbide aggregates. The metal carbide aggregates may diffuse to other metal carbide aggregates and coalesce to form the metal carbide structures. Alternatively, the metal carbide aggregates may undergo Ostwald ripening to form larger metal carbide structures (e.g., nanoclusters, nanocomposites, nanoparticles, etc.). In some embodiments, the metal carbide structures may be formed as layer, such as a monolayer. If present, the metal-rich regions may also form according to the same mechanisms as the metal carbide structures.

In some embodiments, the metal carbide material may comprise the metal carbide structure, a metal-doped carbon-rich region, a metal-rich region, or a combination thereof in a carbon-rich matrix. For example, the metal carbide structure and the metal-doped carbon-rich region may be spatially separated by the carbon-rich matrix of the metal carbide material. If present, the metal-rich region is also spatially separated from the metal carbide structure and the metal-doped carbon-rich region.

The metal carbide may be present as metal carbide structures and in combination with the carbon-rich matrix, where the metal carbide structures, as described above, include the superstoichiometric metal carbide. In some embodiments, the metal carbide structures, such as the MCNs, may be monodispersed in the carbon-rich matrix. The metal carbide structures may be uniformly distributed throughout the carbon-rich matrix. Alternatively, the metal carbide structures are distributed randomly throughout the carbon-rich matrix, or the metal carbide structures are present as a gradient in the carbon-rich matrix. In other embodiments, the metal carbide structures are present as a gradient in the carbon-rich matrix, where the carbon-rich matrix substantially depleted of the metal carbide structures is adjacent to a chalcogenide material at an interface between the metal carbide material and the chalcogenide. The chalcogenide material may be part of an underlying device. The interface may be substantially free of metal. The interface may be substantially free of halides. In some embodiments, the interface may be substantially free of leaving groups from the metal precursor that was partially reacted.

The carbon-rich matrix of the metal carbide material may include graphene, amorphous carbon, diamond-like carbon, or a combination thereof. The carbon in the carbon-rich matrix may be spa hybridized, $sp^2$ hybridized, $sp^1$ hybridized, or a combination thereof. The carbon-rich matrix may include the leaving groups of the metal precursor. In some embodiments, the carbon-rich matrix may be substantially free of hydrogen. In some embodiments, the carbon-rich matrix is substantially free of metal. In other embodiments, the carbon-rich matrix is substantially free of metal and hydrogen. In some embodiments, the carbon-rich matrix may be substantially free of leaving groups from the metal precursor. In some embodiments, the carbon-rich matrix may include unreacted leaving groups from the metal precursor. In some embodiments, the carbon-rich matrix may be substantially free of halides. The carbon-rich matrix may comprise from about 51.0 atomic percent to about 100.0 atomic percent of carbon. In some embodiments, the carbon-rich matrix comprises from about 75.0 atomic percent to about 99.9 atomic percent of carbon. In other embodiments, the carbon-rich matrix comprises from about 85.0 atomic percent to about 99.9 atomic percent of carbon.

The metal-doped carbon-rich region may comprise non-bonded metal atoms dispersed throughout the carbon-rich matrix, such as dispersed and located within vacancies or interstitial spaces of the carbon-rich matrix. The presence of the metal atoms in the carbon-rich matrix produces the metal-doped carbon-rich region. For example (and not by limitation), when the carbon-rich matrix comprises from about 51.0 atomic percent to about 100.0 atomic percent of carbon, metal atoms may be present at from about 0.0 atomic percent to about 49.0 atomic percent of metal atoms. In some embodiments, the metal atoms do not participate in covalent bonding with the surrounding carbon atoms of the carbon-rich matrix (i.e., a non-bonding interaction between metal and carbon). In some embodiments, the metal atoms interact with the surrounding carbon atoms of the carbon-rich matrix via van der Waals forces, induced dipole forces, ionic bonds, or London dispersion forces.

In some embodiments, a metal-rich region is additionally present in the metal carbide material, where the metal-rich region comprises metal-metal bonds and exhibits predominantly metallic character.

The metal carbide material may be formed by an ALD process conducted in a reactor that contains a base material (e.g., a substrate) upon which the metal carbide material is to be formed. The reactor may be a reaction chamber of a conventional deposition chamber, such as a conventional ALD reactor or a conventional CVD reactor, which are not described in detail here. The metal precursor and the carbon-containing precursor may be sequentially introduced into the reactor and reacted to form one or more monolayers of the metal or of the carbon. During the ALD process, metal from the metal precursor and carbon from the carbon-containing precursor are alternatingly adsorbed onto the base material, onto a material(s) overlying the base material, or onto previously formed monolayers of the metal or carbon. To form the metal carbide, the metal precursor and the carbon-containing precursor may be sequentially introduced into the reaction chamber, reacted with the surface of the base material or with previously formed monolayers of the metal, and excess unreacted metal precursor or carbon-containing precursor purged from the reactor. By sequentially exposing the base material to the metal precursor and the carbon-containing precursor, the metal carbide or metal carbide material may be formed on the base material. The introduction of the metal precursor and carbon-containing precursor into the reactor may include, optionally, a carrier gas, such as helium, argon, nitrogen, neon, xenon, hydrogen, or combinations thereof. The process of sequentially introducing the metal precursor and carbon-containing precursor may be repeated for a desired number of cycles until a desired thickness of the metal carbide or metal carbide material is obtained. In between each introduction of the metal precursor and carbon-containing precursor, the reactor may be purged, optionally, with a purge gas to remove the unreacted metal precursor and carbon-containing precursor or reaction byproducts. The purge gas may be an inert gas, such as helium, argon, nitrogen, neon, xenon, hydrogen, or combinations thereof.

By way of example only, the metal carbide or the metal carbide material may be formed to a thickness ranging from a few monolayers to about 100 nm, such as from about 0.1 nm to about 100 nm or from about 5 nm to about 50 nm. However, the metal carbide or the metal carbide material may be formed at greater thicknesses.

While the metal carbide or metal carbide material may be formed by sequentially introducing and reacting the metal precursor and the carbon-containing precursor (i.e., in an ABAB . . . sequence), the precursors may be introduced in a different order than that described above (i.e., in a BABA . . . sequence, an AABAAB . . . sequence, an ABBABB . . . sequence, etc.) depending on the composition of the metal carbide or metal carbide material to be produced. For instance, the carbon-containing precursor may be introduced followed by the introduction of the metal precursor. Depending on the composition of the metal carbide or metal carbide material to be produced, more than one introduction (e.g., pulse) of the metal precursor may be conducted before the carbon-containing precursor is introduced. More than one introduction (e.g., pulse) of the carbon-containing precursor may be conducted following the introduction of the metal precursor.

The reaction between the metal precursor and the carbon-containing precursor according to embodiments of the disclosure may be energetically favorable. Without being bound by any theory, it is believed that the reactive alkyne group or alkene group of the carbon-containing precursor reacts with the metal precursor and displaces the leaving groups to yield the metal carbide or metal carbide material. By way of example only, if the metal precursor is tantalum chloride and the carbon-containing precursor is bis(trimethylsilyl)acetylene, the reaction is believed to proceed favorably with a negative free energy of reaction, indicating a spontaneous reaction.

By way of example only, tantalum carbide may be formed by introducing a tantalum precursor, such as tantalum chloride ($TaCl_5$) into the reactor. One or more monolayers of tantalum may be formed until the desired thickness is achieved. The carbon-containing precursor, such as bis (trimethylsilyl)-acetylene (or $(Me_3Si)_2C_2$), may then be introduced into the reactor, and carbon of the carbon-containing precursor reacted with the monolayers of tantalum to form tantalum carbide. The ALD process may proceed according to the following reaction:

$$2TaCl_5+5(Me_3Si)_2C_2\rightarrow 2TaC_5+10(Me_3Si)Cl.$$

Each of the metal precursor, carbon-containing precursor, and purge gas may be introduced into the reactor at a flow rate of from about 1 standard cubic centimeters (sccm) to about 2000 sccm, such as from about 1 sccm to about 1000 sccm. Each of the metal precursor and carbon-containing precursor may remain in the reactor for an amount of time ranging from about 0.1 second to 100 seconds, sufficient for the metal precursor and carbon-containing precursor to react.

The ALD process may be conducted at a temperature of less than or equal to about 300° C., such as from about 20° C. to less than or equal to about 450° C. The temperature within the reactor and of the base material may be maintained at from about 20° C. to about 450° C. while the ALD process occurs. By way of example only, the ALD process may be conducted at a temperature of from about 100° C. to about 450° C., from about 150° C. to about 300° C., from about 200° C. to about 300° C., from about 100° C. to about 250° C., or from about 100° C. to about 200° C. The low temperature at which the metal carbide or metal carbide material is formed according to embodiments of the disclosure may reduce the thermal budget relative to that of conventional processes (e.g., sputtering methods) of forming metal carbides. The ALD process according to embodiments of the disclosure may also enable the metal carbide or metal carbide material to be conformally formed although heat or oxidation sensitive materials are present. Thus, the metal carbide or metal carbide material may be formed adjacent to such sensitive materials without degrading, decomposing, or otherwise negatively affecting the materials.

The metal precursor and carbon-containing precursor may be sufficiently reactive with one another that a plasma is not utilized during the ALD process. Thus, the ALD process for forming the metal carbide according to embodiments of the disclosure may be conducted without generating a plasma during the ALD process. However, depending on the thermal sensitivity of adjacent and exposed materials on the base material, a plasma may be used to increase the reactivity of the metal precursor and carbon-containing precursor. For instance, if the adjacent and exposed materials on the base material are not thermally sensitive or are less thermally sensitive, the deposition temperature may be increased or a plasma may be used. The plasma may be generated in the reactor (e.g., a direct plasma) or the plasma may be generated outside the reactor and supplied to the reactor (e.g., a remote plasma).

A method 100 of forming the metal carbide or metal carbide material by ALD is illustrated in FIG. 1. The method 100 includes the act 102 of reacting a metal precursor with a base material to form metal (e.g., metal monolayers) on the base material. The metal monolayers are formed by introducing the metal precursor of the formula $MX_n$ into a reaction chamber, such as an ALD chamber, that contains the base material. The method 100 further includes the act 104 of reacting a carbon-containing precursor comprising at least one alkyne group or alkene group with the metal (e.g., metal monolayers) to form carbon monolayers on the metal monolayers, as described above. The acts 102 and 104 may be repeated, as in act 106, until the desired thickness of the metal carbide or metal carbide material is achieved by sequentially forming the metal monolayers and carbon monolayers or according to the various deposition sequences described above. Alternatively, act 102 may be repeated until a desired thickness of the metal monolayers is achieved. Similarly, act 104 may be repeated until a desired thickness of the carbon monolayers is achieved. The method further includes the act 108 of reacting the metal monolayers and the carbon monolayers to form the metal carbide or metal carbide material on the base material by ALD. The carbon-containing precursor is sufficiently reactive with the metal monolayers to form the metal carbide or metal carbide material by the ALD process. Additionally, the metal precursor is sufficiently stable to be used under vapor delivery conditions of the ALD process. The metal carbide or metal carbide material may be conformally formed over the base material.

The method 100 may optionally include disposing an electrophilic precursor on the metal carbide material, as illustrated in act 110, to introduce carbon. The electrophilic precursor may be a carbon halide, where each halide may be independently selected from fluoride, chloride, bromide, or iodide. In some embodiments, disposing the electrophilic precursor on the metal carbide material produces a carbon material, which may include $sp^1$ hybridized carbon, $sp^2$ hybridized carbon, spa hybridized carbon, or any combination thereof. The electrophilic precursor may be a perhalogenated alkane, alkene, aromatic, or any combination thereof. The electrophilic precursor may also be perhalogenated ethane, ethane, ethylene, propylene, butene, butadiene, benzene, naphthalene, toluene, tetralkylorthocarbonate, or tetrakis(dialkylamino)methane, where the electrophilic precursor may be perhalogenated with the same halide or different halides. The electrophilic precursor may also be a Group (V) halide, such as phosphorous halide, arsenic halide, or antimony halide, where each halide may be the same or different. The electrophilic precursor may be a Group (V) alkoxide, such as trimethyl phosphite. In some embodiments, the electrophilic precursor may be a carbon alkoxide, such as tetramethoxymethane ($C(OMe)_4$). The electrophilic precursor may also be a Group (V) amide, such as tris(dimethylamino)phosphine ($P(NMe_2)_3$). In some embodiments, the electrophilic precursor may be sufficiently reactive with the carbon-containing precursor.

The method 100 may optionally include disposing a scavenger on the metal carbide material to remove excess X (e.g., leaving group, halide) atoms from the surface of the metal carbide or metal carbide material, as illustrated in act 112. The scavenger may be a silane, a germane, a substituted silane, a substituted germane, trimethylaluminum, an alkylaluminum, an alkylgallium, an alkylindium, a borane, or an alkylamino group ($NR^1R^2R^3$), or a combination thereof. The alkylamino group may exhibit a strong affinity for the leaving group (X), as described by the following reaction:

$$MX_n+NR_y \rightarrow RMX_{n-1}+XNR_{y-1}$$

The resulting metal carbide or metal carbide material may be substantially free of hydrogen, particularly when the carbon-containing precursor includes at least one alkyne. The metal carbide material may include a hydrogen-terminated surface when the carbon-containing precursor is an organometallic alkene.

Figure 2:
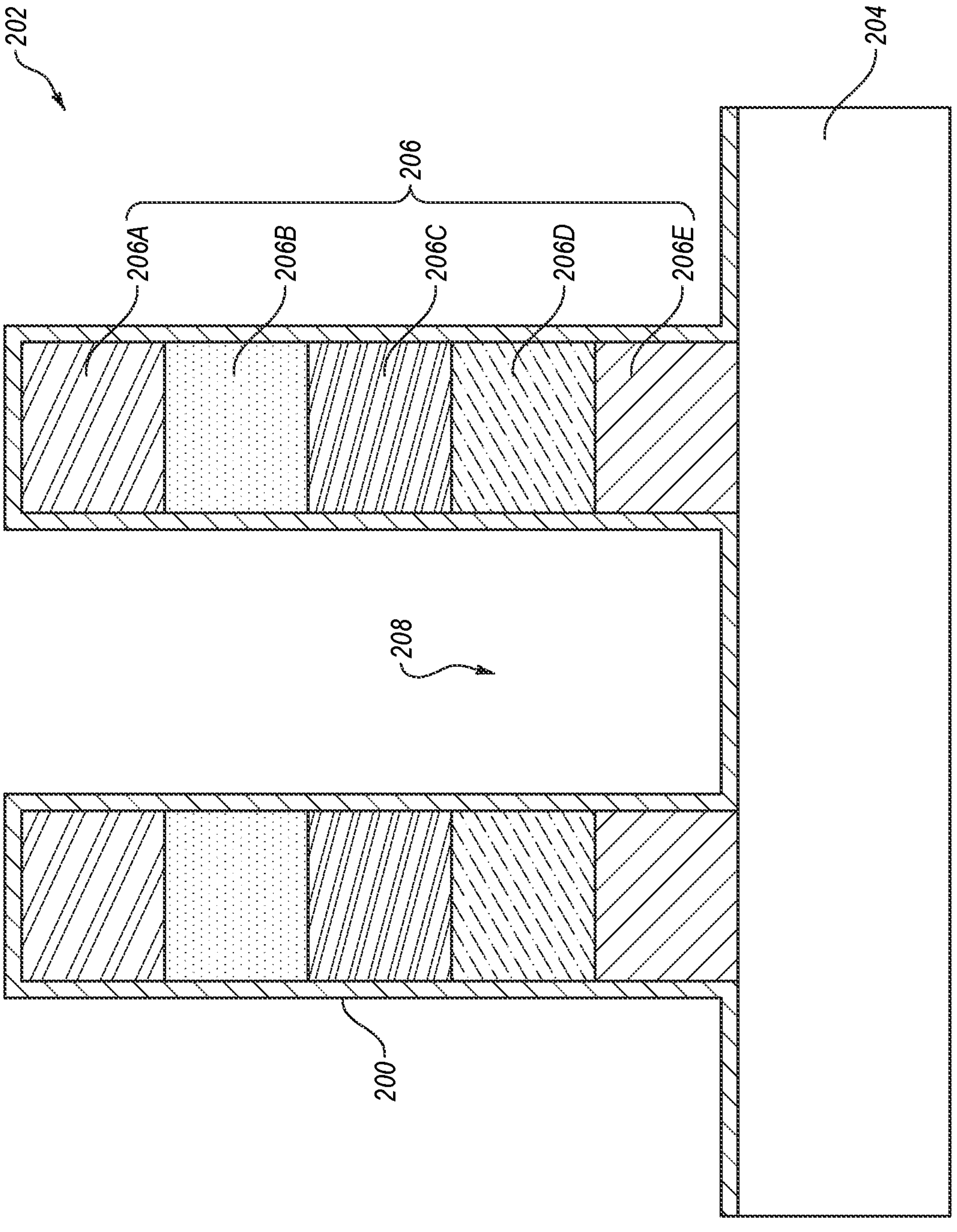
FIG. 2 is a cross-sectional view of an electronic device including a metal carbide material according to embodiments of the disclosure.

As shown in FIG. 2, a metal carbide material 200 of an electronic device 202 may be conformally formed adjacent to (e.g., on) at least one feature 206 with a high aspect ratio (HAR). The feature 206 may be formed of a stack of materials (206A, 206B, 206C, 206D, 206E) on a base material 204, where the materials may include at least one chalcogenide material or at least one other thermally- or oxidation-sensitive material. The materials of the stack may include, but are not limited to, chalcogenide materials, organic (e.g., carbon) materials, carbon allotropes (e.g., graphite), reactive metals (e.g., tungsten, aluminum, or tantalum) or other materials sensitive to processing conditions when the materials of the stack are exposed. While FIG. 2 illustrates the stack as including five materials, the stack may include a single material, may include two or more materials, or may include more than 5 materials. The features 206 are separated from each other by openings 208. The materials of the features 206 are formed adjacent to (e.g., over) the base material 204 using conventional techniques, such as photolithography, physical vapor deposition (PVD), chemical vapor deposition (CVD), atomic layer deposition (ALD). Depending on the intended application of the electronic device 202, the base material 204 may include one or more materials, layers, structures, or regions thereon. The features 206 may have an aspect ratio of at least about 10:1, at least about 20:1, at least about 25:1, or at least about 50:1. While FIG. 2 illustrates the electronic device 202 as including the metal carbide material 200 on the HAR features 206, the electronic device 202 may alternatively include the metal carbide conformally formed on the stack. Alternatively, the metal carbide material 200 may be formed as a planar material (not shown) or on low aspect ratio features (not shown) of the electronic device 202.

The metal carbide or metal carbide material 200 may be formed over the features 206 according to embodiments of the disclosure as described above. By way of example only, the metal carbide or metal carbide material 200 may be formed by sequentially exposing the features 206 of the electronic device 202 to the metal precursor and the carbon-containing precursor. The metal carbide or metal carbide material 200 may function as a conductive material of a component of the electronic device 202, such as a transistor, a capacitor, an electrode, an etch-stop material, a gate, a barrier material, or a spacer material. One or more materials and/or structures, such as a gate, may subsequently be formed in the openings 208 by conventional techniques and additional process acts conducted to form a complete electronic device containing the electronic device 202.

The metal carbide or metal carbide material 200 may be conformally formed on the features 206 according to embodiments of the disclosure. The thickness of the metal carbide material 200 on sidewalls of the features 206 may be substantially uniform. By way of example only, the metal carbide material 200 may be formed to a thickness ranging from a few monolayers to about 100 nm, such as from about 0.1 nm to about 100 nm or from about 5 nm to about 50 nm. However, the metal carbide material 200 may be formed at greater thicknesses. The metal carbide material 200 may be in direct contact with all of the materials of the stacks of the features 206 or some of the materials of the stacks of the features 206. The metal carbide material 200 may also be in contact with the base material 204.

Figure 3:
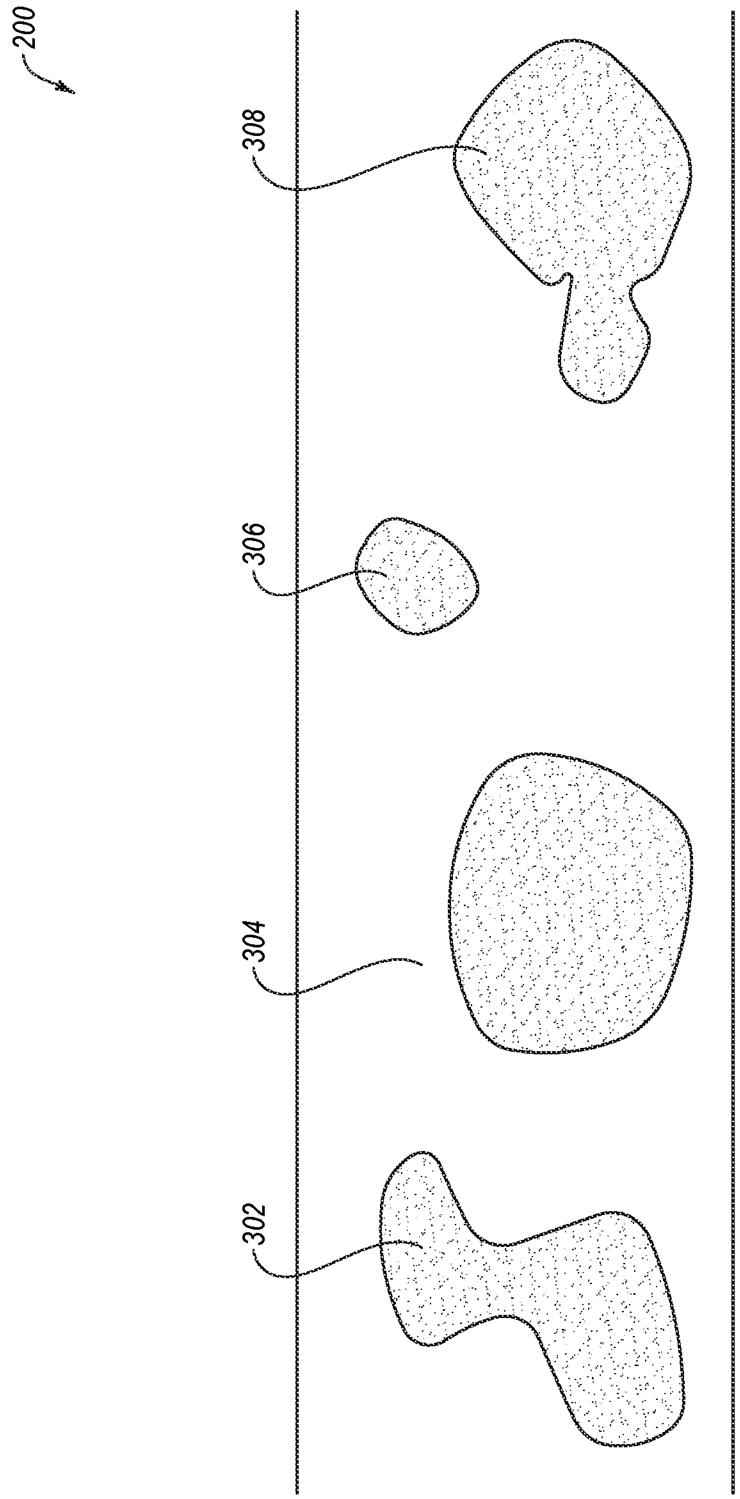
FIG. 3 is a cross-sectional view of a metal carbide material according to embodiments of the disclosure.

The metal carbide material 200 is depicted in FIG. 2 as a single material for convenience, but the metal carbide material 200 may include a metal carbide structure, metal-rich region, metal-doped carbon-rich region in a carbon-rich matrix, as described above and as illustrated in FIG. 3. In some embodiments, the metal carbide material 200 comprises regions of metal carbide structures 302, such as the metal carbide nanoclusters, MCNs, MCNPs described above. The metal carbide structures 302 may comprise a superstoichiometric metal carbide, as formed according to the methods described herein. In other embodiments, the metal carbide structures 302 comprise a combination of the superstoichiometric metal carbide and a nonstoichiometric metal carbide. The metal carbide structures 302 may be dispersed within a carbon-rich matrix 304, as illustrated in FIG. 3. In some embodiments, the metal carbide structures 302 are monodispersed throughout the carbon-rich matrix 304. In other embodiments, the metal carbide structures 302 form a gradient within the carbon-rich matrix 304. In certain embodiments, the metal carbide structures 302 are present as MCNs in a gradient, where the MCN-poor regions are adjacent to the base material 204. The metal carbide material 200 may also further comprise metal-doped carbon-rich regions 306, as described above. Metal-rich regions 308 may also be formed as described above, where the metal-rich regions 308 comprise predominantly metal-metal bonds and metallic character. In some embodiments, the metal carbide structures 302, metal-doped carbon-rich regions 306, metal-rich regions 308 comprise from about 0.1 mol % to about 50 mol % of the metal carbide material 200. The carbon-rich matrix may comprise from about 50% mol % to about 99.9% mol % of the metal carbide material 200.

For example (and not by limitation), the carbon-rich matrix may be adjacent to the base material 204, and a region rich in metal carbide structures may be adjacent to the carbon-rich matrix. In some embodiments, the metal-doped carbon-rich region may be adjacent to the metal carbide-rich region. When the base material 204 includes a thermally sensitive material, the metal carbide material 200 may comprise a carbon-rich matrix adjacent to the chalcogenide material or other thermally sensitive material. In some embodiments, the metal carbide material 200 may be formed adjacent to the base material 204 (or adjacent to features on or in the base material 204), where the metal carbide material 200 includes a region rich in metal carbide structures 302 adjacent to the base material 204.

Accordingly, a method of forming a metal carbide or a metal carbide material is disclosed. The method comprises reacting a metal precursor with a base material to form a metal on the base material. The metal precursor comprises the chemical formula $MX_n$, where M is a metal, X is a leaving group, and n is an oxidation state of the metal. A carbon-containing precursor comprising at least one alkyne group or at least one organometallic alkene is reacted with the metal to form carbon on the metal. The metal and the carbon are reacted to form a metal carbide or a metal carbide material on the base material by ALD.

Additionally, a method of forming an electronic device is disclosed. The method comprises forming high aspect ratio features on a base material, where the high aspect ratio (HAR) features comprise a stack of materials. The HAR features are exposed to a metal precursor to form a metal on the HAR features and the HAR features are exposed to a carbon-containing precursor to form carbon on the metal. The carbon-containing precursor comprises at least one alkyne group or an organometallic alkene. The metal and the carbon are reacted to form a metal carbide or a metal carbide material on the HAR features.

Accordingly, an electronic device is also disclosed. The electronic device comprises a stack of materials adjacent to a base material. The stack comprises at least one chalcogenide material. The electronic device also comprises a metal carbide material on the stack, where the metal carbide material comprises metal carbide structure comprising a superstoichiometric metal carbide comprising the chemical formula $MC_n$, where M is a metal, C is carbon, and n is a rational number between 2.0 and 6.0. The metal carbide structure is dispersed in a carbon-rich matrix.

Figure 4:
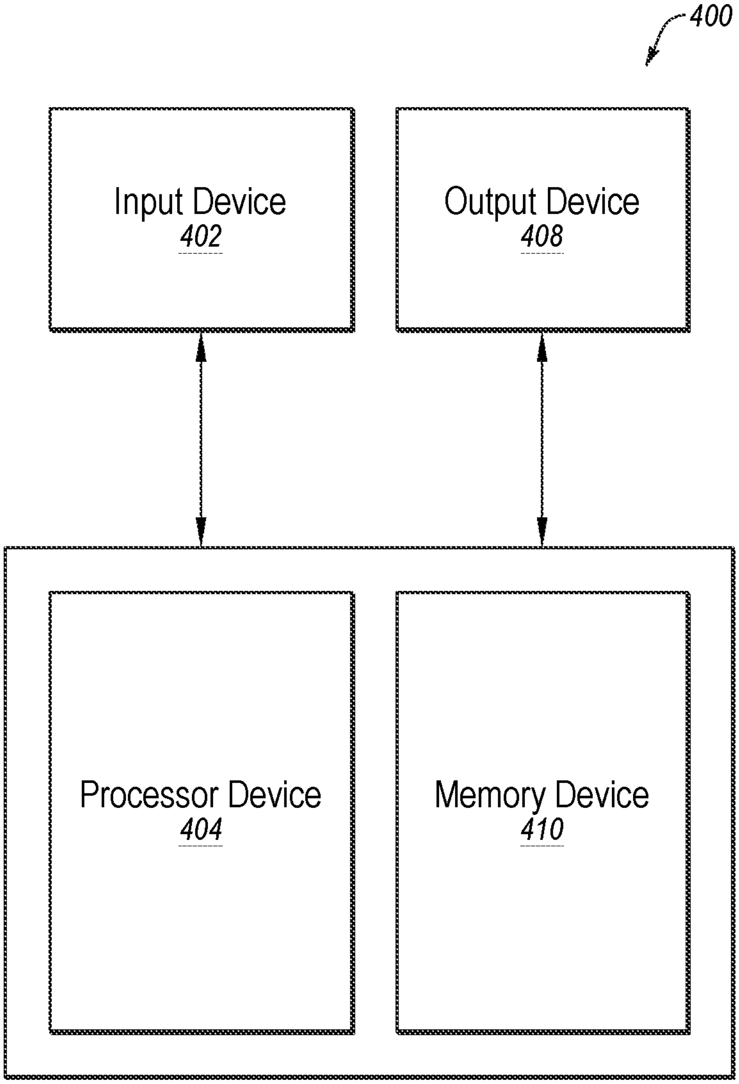
FIG. 4 is a schematic block diagram illustrating a system including one or more electronic devices according to embodiments of the disclosure.

One or more electronic devices 202 (e.g., semiconductor device, memory device, logic device) that include the metal carbide or metal carbide material 200 according to embodiments of the disclosure may be present in an electronic system 400 as shown schematically in FIG. 4. By way of example only, the metal carbide or metal carbide material 200 may be a component of a transistor, a capacitor, an electrode, an etch-stop material, a gate, a barrier material, or a spacer material in the electronic device. By way of example only, the electronic device 202 may be a DRAM memory device, a 3D crosspoint memory device, a PCRAM memory device, a NAND memory device, or other electronic device including one or more materials sensitive to oxidation and/or heat. The metal carbide or metal carbide material 200 according to embodiments of the disclosure may also be used in other electronic devices where protection of sensitive materials is desired. Additional processing acts may be conducted to form the electronic device containing the metal carbide or metal carbide material 200 according to embodiments of the disclosure.

The electronic system 400 includes one or more electronic devices 202 that include the metal carbide or metal carbide material 200 according to embodiments of the disclosure. The metal carbide or metal carbide material 200 may be present, for example, in one or more memory cells of one or more memory devices 410. The electronic system 400 may include a processor device 404 electronically coupled to an input device 402. The processor device 404 may be a microprocessor configured to control the processing of system functions and requests in the electronic system 400. The processor device 404 may also include the metal carbide material 200 according to embodiments of the disclosure. The electronic system 400 may further include the memory device 410 electronically coupled to an output device 408, where the memory device 410 comprises one or more electronic devices 202 comprising the metal carbide or metal carbide material 200 according to embodiments of the disclosure. The electronic system 400 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPad® or SURFACE® tablet, an electronic book, a navigation device, etc.

Accordingly, an electronic system is disclosed. The electronic system comprises a processor operably coupled to an input device and an output device, and a memory device operably coupled to the processor. The memory device comprises a conductive material, which comprises a carbon-rich matrix and a superstoichiometric metal carbide. The superstoichiometric metal carbide has the chemical formula $MC_n$, where M is a metal, C is carbon, and n is a rational number between 2.0 and 7.0.

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure.

What is claimed is:

1. A method of forming a metal carbide or a metal carbide material, the method comprising:

reacting a metal precursor with a base material to form a metal on the base material, the metal precursor comprising the chemical formula $MX_n$, where M is a metal, X is a leaving group, and n is an oxidation state of the metal;

reacting a carbon-containing precursor comprising at least one alkyne group or at least one organometallic alkene with the metal to form carbon on the metal;

reacting the metal and the carbon to form a metal carbide or a metal carbide material on the base material by ALD; and disposing an electrophilic precursor on the metal carbide or the metal carbide material to form a final metal carbide material comprising one or more metal carbides dispersed in a carbon-rich matrix, the electrophilic precursor comprising a carbon halide, a perhalogenated alkane, a perhalogenated alkene, a perhalogenated aromatic, a Group (V) halide, or a combination thereof.

2. The method of claim 1, wherein reacting a metal precursor with a base material to form metal on the base material comprises reacting the metal precursor comprising a metal comprising a Group IV element, a Group V element, or a combination thereof.

3. The method of claim 1, wherein reacting a carbon-containing precursor comprising at least one alkyne group or at least one organometallic alkene with the metal to form carbon on the metal comprises reacting the carbon-containing precursor comprising the chemical formula $R_1R_2R_3(A)$-$C_i$-$(Z)R_4R_5R_6$ with the metal, wherein each of $R_1$, $R_2$, $R_3$, $R_4$, $R_5$, and $R_6$ are independently selected from a hydrogen, an alkyl group, a substituted alkyl group, an alkoxide, a substituted alkoxide, an alkylamino, a substituted alkylamino, a dialkylamido, a halide, or a combination thereof;

wherein i is 2, 4, or 6; and wherein A and Z are independently selected from silicon (Si), germanium (Ge), or tin (Sn).

4. The method of claim 3, wherein reacting a carbon-containing precursor comprising at least one alkyne group or at least one organometallic alkene with the metal to form carbon on the metal comprises reacting a carbon-containing precursor of the chemical formula $R_1R_2R_3(A)$-$C_i$-$(Z)R_4R_5R_6$ with the metal, wherein A and Z are the same element.

5. The method of claim 1, wherein reacting a carbon-containing precursor comprising at least one alkyne group or at least one organometallic alkene with the metal to form carbon on the metal comprises reacting bis(trimethylsilyl) acetylene with the metal.

6. The method of claim 1, wherein reacting a carbon-containing precursor comprising at least one alkyne group or at least one organometallic alkene with the metal comprises reacting a carbon-containing precursor comprising the chemical formula $R_1R_2R_3(A)$-$C_6H_4$-$(Z)R_4R_5R_6$ with the metal, wherein each of $R_1$, $R_2$, $R_3$, $R_4$, $R_5$, and $R_6$ are independently selected from a hydrogen, an alkyl group, a substituted alkyl group, an alkoxide, a substituted alkoxide, an alkylamino, a substituted alkylamino, a dialkylamido, a halide, or any combination thereof; and wherein A and Z are independently selected from silicon (Si), germanium (Ge), or tin (Sn).

7. The method of claim 1, wherein reacting the metal and the carbon to form a metal carbide or a metal carbide material on the base material by ALD comprises forming the metal carbide or the metal carbide material by ALD without using a plasma.

8. The method of claim 1, wherein forming a metal precursor on a base material and reacting a carbon-containing precursor comprises conducting the forming and the reacting at a temperature of from about 25° C. to about 450° C.

9. The method of claim 1, wherein disposing an electrophilic precursor on the metal carbide or the metal carbide material to form a final metal carbide material comprises forming the final metal carbide material comprising the one or more metal carbides including a superstoichiometric metal carbide dispersed in the carbon-rich matrix, and a metal-doped carbon-rich region.

10. The method of claim 1, wherein disposing an electrophilic precursor on the metal carbide or the metal carbide material to form a final metal carbide material comprises forming the one or more metal carbides dispersed in the carbon-rich matrix that is substantially free of hydrogen.

11. The method of claim 1, wherein disposing an electrophilic precursor on the metal carbide or the metal carbide material to form a final metal carbide material comprises forming the final metal carbide material comprising the one or more metal carbides including a superstoichiometric metal carbide dispersed in the carbon-rich matrix, the superstoichiometric metal carbide comprising metal carbides of the formula $MC_n$, where n is a rational number from about 2.0 to about 7.0.

12. The method of claim 1, wherein disposing an electrophilic precursor on the metal carbide or the metal carbide material to form a final metal carbide material comprises forming the final metal carbide material exhibiting a metal content of from about 0.5 atomic percent of metal to about 20.0 atomic percent of metal.

* * * * *